(12) United States Patent
Barr (10) Patent No.: US 7,513,779 B2
(45) Date of Patent: Apr. 7, 2009

(54) CONNECTOR HAVING A BYPASS CAPACITOR AND METHOD FOR REDUCING THE IMPEDANCE AND LENGTH OF A RETURN-SIGNAL PATH

(75) Inventor: Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/455,638

(22) Filed: Jun. 4, 2003

(65) Prior Publication Data

US 2004/0248432 A1    Dec. 9, 2004

(51) Int. Cl.
*H01R 12/00* (2006.01)
(52) U.S. Cl. .................. 439/65; 439/607; 439/620.2
(58) Field of Classification Search .............. 439/65, 439/95, 108, 67–75, 109, 607, 620.2, 620.09, 439/620.1
See application file for complete search history.

(56) References Cited

U.S. PATENT DOCUMENTS

| | | | | | |
|---|---|---|---|---|---|
| 4,653,838 | A | * | 3/1987 | Ney et al. | 439/620.11 |
| 4,734,818 | A | | 3/1988 | Hernandez et al. | |
| 4,751,435 | A | | 6/1988 | Roche et al. | |
| 4,762,500 | A | * | 8/1988 | Dola et al. | 439/79 |
| 4,784,618 | A | | 11/1988 | Sakamoto et al. | |
| 4,930,200 | A | * | 6/1990 | Brush et al. | 29/25.42 |
| 5,039,963 | A | | 8/1991 | Fischer | |
| 5,145,413 | A | | 9/1992 | Okamoto et al. | |
| 5,188,543 | A | | 2/1993 | Swift | |
| 5,190,462 | A | * | 3/1993 | Lauchner et al. | 439/65 |
| 5,192,231 | A | | 3/1993 | Dolin, Jr. | |
| 5,403,195 | A | | 4/1995 | Thrush et al. | |
| 5,580,280 | A | * | 12/1996 | Minich et al. | 439/620.22 |
| 5,686,871 | A | * | 11/1997 | Baran | 333/12 |
| 5,687,233 | A | | 11/1997 | Loudermilk et al. | |
| 5,851,122 | A | | 12/1998 | Huber et al. | |
| 5,967,848 | A | | 10/1999 | Johnson et al. | |
| 6,019,616 | A | * | 2/2000 | Yagi et al. | 439/108 |
| 6,053,771 | A | * | 4/2000 | Hood et al. | 439/607 |
| 6,152,747 | A | * | 11/2000 | McNamara | 439/108 |
| 6,176,744 | B1 | * | 1/2001 | Zito et al. | 439/660 |
| 6,186,834 | B1 | | 2/2001 | Arnett et al. | |

(Continued)

FOREIGN PATENT DOCUMENTS

GB    2169157 A    7/1986

(Continued)

OTHER PUBLICATIONS

IEEE modeling problem from: www.ewh.ieee.org/cmte/tc9/standard/standard-2000-01.pdf.*

*Primary Examiner*—Renee S Luebke
*Assistant Examiner*—Xuong M Chung-Trans (57) ABSTRACT

The invention includes a device and method providing a return-signal pathway through a circuit board connector. In one embodiment of the invention, a circuit board connector having an integral bypass capacitor provides a return-signal path between the circuit boards without using the ground planes of the circuit boards outside of an area occupied by the connector. The circuit board connector includes first connector reference conductor arranged for coupling with a first circuit-board reference plane, a second connector reference conductor arranged for coupling with a second circuit-board reference plane, and a capacitor coupled between the first and second reference planes.

18 Claims, 4 Drawing Sheets

U.S. PATENT DOCUMENTS

| | | | |
|---|---|---|---|
| 6,445,590 B1 * | 9/2002 | Dow | 361/760 |
| 6,540,558 B1 * | 4/2003 | Paagman | 439/608 |
| 6,544,061 B1 | 4/2003 | Yasufuku et al. | |
| 6,654,840 B1 | 11/2003 | Gendo et al. | |
| 6,807,066 B2 * | 10/2004 | Hayama et al. | 361/788 |
| 6,900,991 B2 * | 5/2005 | Patel et al. | 361/782 |

FOREIGN PATENT DOCUMENTS

| | | |
|---|---|---|
| WO | WO00/45472 | 8/2000 |
| WO | WO03/067711 | 8/2003 |
| WO | WO03/067711 A2 | 8/2003 |

\* cited by examiner

CONNECTOR HAVING A BYPASS CAPACITOR AND METHOD FOR REDUCING THE IMPEDANCE AND LENGTH OF A RETURN-SIGNAL PATH

BACKGROUND

A driver circuit is typically used to drive an electrical signal onto a conductive path, such as a circuit board trace, which is connected to a receiver circuit. The signal requires a return path from the receiver back to the driver. More specifically, to generate a positive voltage signal in a theoretical sense, the driver generates the signal by removing positive charge from a signal-reference plane, such as a VCC plane, and driving the positive charge onto the conductive path to the receiver. Once the charge reaches the receiver, it returns to the signal-reference plane via a return-signal path having the least impedance (if there are multiple return paths to choose from). The signal path or loop followed by the signal from driver to receiver, and from receiver back to driver, is referred to herein as a transmission path. The longer the return-signal path, the higher are its impedance and impedance discontinuities, and the more likely the signal is to generate cross talk or electromagnetic interference (EMI). Unfortunately, when the driver and receiver are mounted on separate circuit boards and connected by a connector, or are separated by one or more intervening circuit boards, the return-signal path may be relatively long and have numerous impedance discontinuities.

Therefore, for maximum signal integrity and low EMI, it is important to minimize the length, loop area, and inductance of a return-signal path. Where the return path is not confined to a single circuit board, it may follow a discontinuous path across signal-reference planes of the several circuit boards. Because the signal reference planes of the separate circuit boards may not be connected together, the return-signal must "jump" between the reference planes via bypass capacitors and the ground planes of the circuit boards. That is, bypass capacitors provide a way for the return signal to jump between the reference planes of separate circuit boards by allowing the return signal to move to and from the ground planes for conduction through the circuit board connectors. Ideally, bypass capacitors would be located physically close enough to a return-signal pin of the circuit board connector to provide a short, low impedance return-signal path. However, because of manufacturing and circuit-board-space limitations, bypass capacitors seldom can be placed close enough to a return-signal pin.

Figure 1:
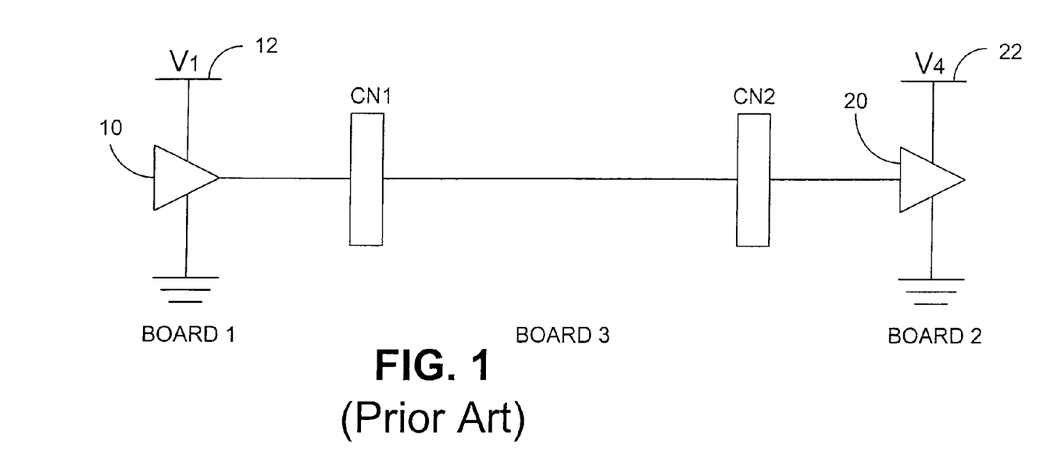
FIG. 1 is a block diagram illustrating a conventional multi-circuit board signal path.
Figure 2:
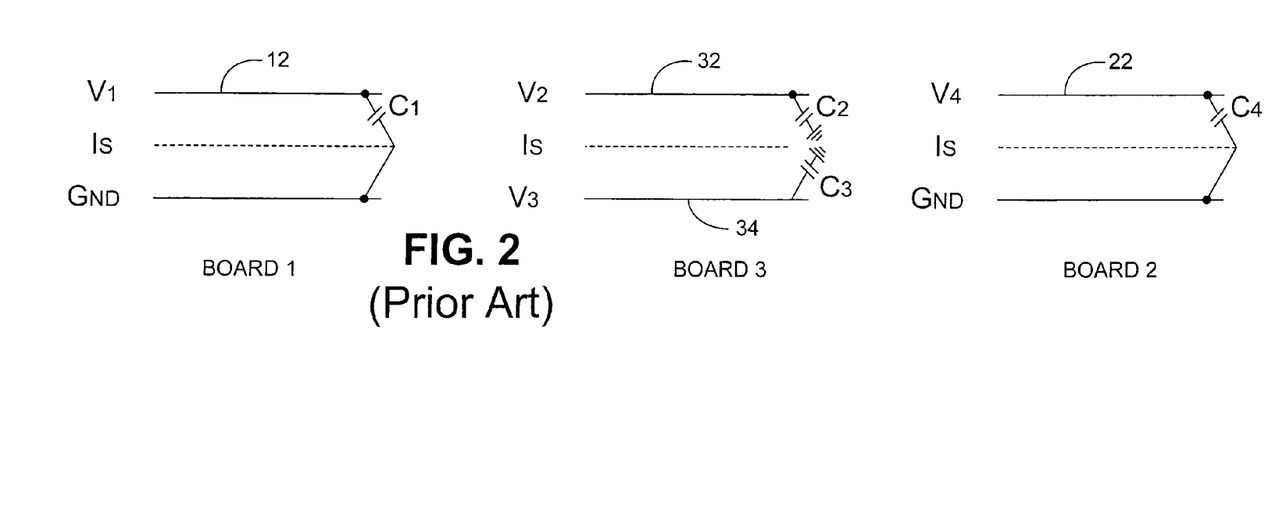
FIG. 2 is a block diagram illustrating the respective voltage-reference-plane stack-up of the circuit boards of FIG. 1.

FIG. 1 is a block diagram illustrating a driver 10 located on a circuit board 1, a receiver 20 located on a circuit board 2, and coupled together through a circuit board 3 by connectors CN1 and CN2. FIG. 2 is a block diagram illustrating the voltage-reference-plane stack-up of the components of FIG. 1. Circuit board 1 includes a signal-reference plane 12 at voltage V1, signal conductor $I_S$, a ground plane (GND), and a bypass capacitor C1. Circuit board 2 includes a reference plane 22 at voltage V4, a signal conductor $I_S$, a ground plane (GND), and a bypass capacitor C4. Circuit board 3 includes a reference plane 32 at voltage V2, a reference plane 34 at voltage V3, a signal conductor $I_S$, bypass capacitors C2 and C3, and a ground plane (omitted for clarity). For the purposes of this background, it will be assumed that voltages V1, V2, V3, and V4 are all different and thus the reference planes are not connected to one another.

Here, a "plane" is a conductor that covers virtually the entire area of one layer of the circuit board, and "trace" is a conductor that is much thinner than a plane, and thus covers only a small area of one layer of the circuit board. Thus, a circuit board layer may include many traces and no plane, or include only one or more planes but no traces. In addition, the circuit boards may include a plurality of return-signal paths for different return signals.

Typically, a high-speed digital signal output by the driver 10 will switch between two voltages, here V1 on the power plane 12 and ground (GND). The high-speed electrical digital signal is received by receiver 20 and typically switches between the same two voltages, here V4 on the power plane 22 and ground GND, where V1=V4. A problem arises when the reference (power) planes for the driver 10 and the receiver 20 are physically different. This can occur when the driver 10 and the receiver 20 are on the same circuit board but reference different power planes. The problem can also occur when the driver 10 and the receiver 20 are on different circuit boards, or when one of the power planes on an intermediate circuit board between the circuit board carrying the driver 10 and the circuit board carrying the receiver 20, such circuit board 2, provides a reference plane for the high-speed signal.

The high-speed electrical signal would like to flow in a path having a minimum impedance from the power plane 12 through the driver 10, through a signal conductor to the receiver 20, then find a return path back to the power plane 12. In the assembly illustrated in FIGS. 1 and 2, the forward path includes the signal conductors $I_S$ of circuit boards 1, 2, and 3, which are interconnected by connectors CN1 and CN2. Connectors CN1 and CN2 may be any type of coupling device to connect the conductors of one circuit board to another circuit board, and may include a flex cable.

To complete the electrical circuit, a return-signal current path is required from the receiver 20 to the plane 12. The return signal will typically follow a path having the lowest relative impedance. For example, the return signal may flow to the power plane 22 (V4) on circuit board 2. To flow from board 2 to board 3, it will follow a path from power plane 22 (V4) through the bypass capacitor C4 on the circuit board 2 to the ground (GND) plane on the board 2. The return signal then flows on the ground (GND) plane of board 2 to and through the ground contacts of connector CN2 to the ground plane (not shown) of circuit board 3. The return signal then flows along the ground plane to either, or both, bypass capacitors C2 and C3, where it will flow to the power planes V2 and/or V3. The return signal will continue on these power planes, and then, as the return signal approaches connector CN1, it must flow back to the ground plane (GND) of circuit board 3 through other bypass capacitors (not shown). The return signal will then be carried on the ground contacts (not shown) of connector CN1 to the ground plane (GND) of circuit board 1, where it will travel on the ground plane until it reaches capacitor C1, and then flow to power plane 12 (V1) completing the return. This return path may distort the signal because of the increased signal path length, impedance, and the loop area of the path.

SUMMARY

In an embodiment of the invention, a circuit board connector that includes a first connector reference conductor arranged for coupling with a first circuit-board reference plane, a second connector reference conductor arranged for coupling with a second circuit-board reference plane, and a capacitor coupled between the first connector reference conductor and the second connector reference conductor.

These and various other features as well as advantages of the present invention provide a shorter return path, minimize discontinuities, and preserve valuable circuit board space for other uses.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like referenced numerals identify like elements, and wherein:

DETAILED DESCRIPTION

In the following detailed description of exemplary embodiments of the invention, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense.

Figure 3:
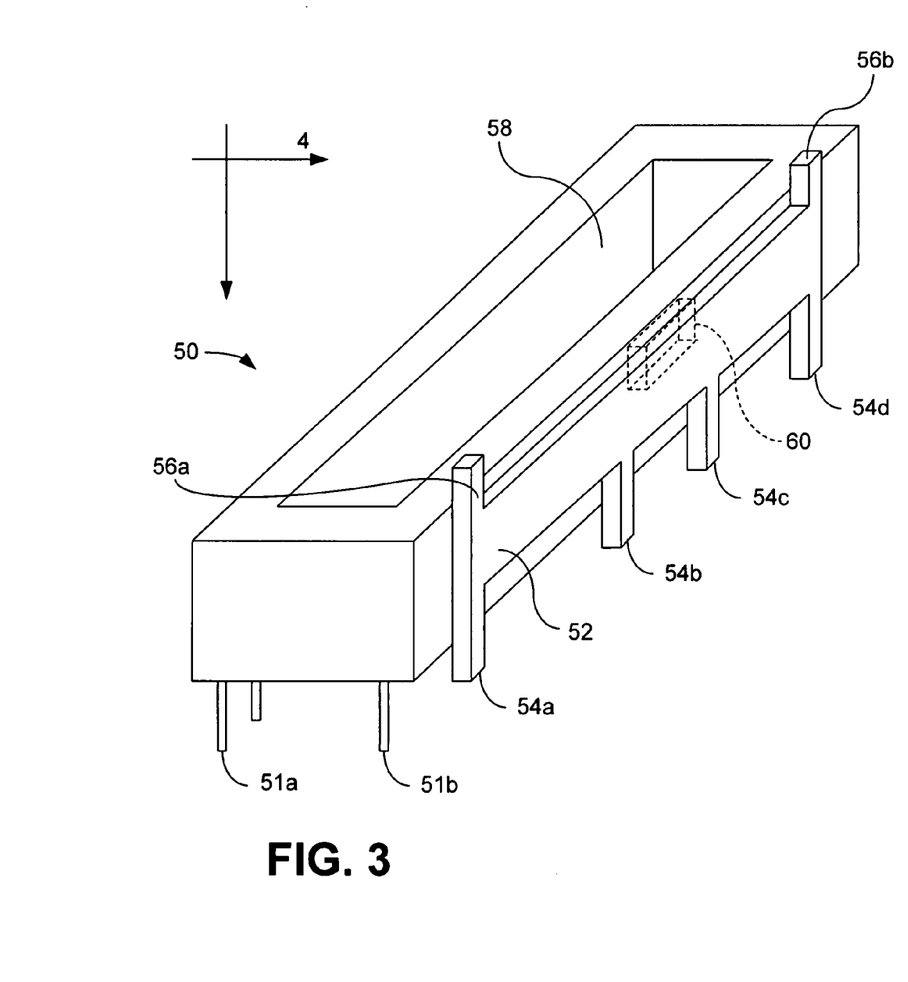
FIG. 3 is a perspective illustration of a circuit board connector having a ground plane, a return-signal plane, and a high-frequency bypass capacitor according to an embodiment of the invention.
Figure 4:
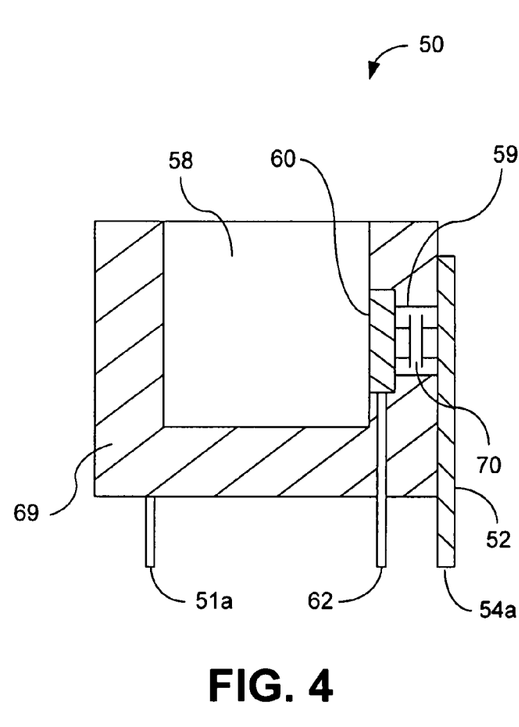
FIG. 4 is a cross-section view of the connector of FIG. 3.

FIGS. 3 and 4 illustrate a circuit board connector 50 having a connector ground plane 52, a return-signal plane 60, and a high-frequency bypass capacitor 70, according to an embodiment of the invention. FIG. 3 is a perspective illustration of the connector 50, and FIG. 4 is a cross-section view of the connector 50.

The connector 50 includes contact-pin rows 51a and 51b, a circuit board receptacle 58, and an aperture 59. The connector 50 is made from an insulating material and can be any connector-type known to those in the art for connecting the conductors of separate circuit boards. The connector 50 may be a single body for mounting on a motherboard, with contact pin rows 51a and 51b arranged for connection with the conductors of the motherboard, and circuit board receptacle 58 arranged for receiving conductors of a daughter board. For example, the connector 50 may be mounted on the circuit board 1 of FIG. 1, and the receptacle 58 arranged to receive and electrically couple with the electrical contacts of circuit board 3. The electrical contacts of connector 50 are omitted from FIGS. 3 and 4 for clarity except as required to illustrate the described embodiment. Alternatively, the connector 50 may include a two-part mating body. In the embodiments of the claimed invention described herein, a connector may include a male-female mating pair. However, for simplicity, a connector is illustrated herein as a female portion of a male-female mating pair.

The connector ground plane 52 includes a sheet of conductive material having a central portion extending along a length of the connector 50, and having a first plurality of the ground contacts 54a-d arranged for coupling with a first circuit board ground plane, such as the ground (GND) plane of circuit board 1. The ground plane 52 may also have a second plurality of ground contacts 56a and 56b arranged for coupling with a second circuit board ground plane, such as ground (GND) plane of circuit board 2 or 3, forming a common-ground plane between the two circuit boards.

The return-signal plane 60 includes a sheet of conductive material having a central portion extending along a portion of a length of the conductor 50, and having at least one and preferably a plurality of contact pins, illustrated as pin 62. The contact pin 62 is arranged for coupling with a return-signal plane of a circuit board, such as the reference plane 22 at voltage V4 of board 2 or the reference plane 12 at voltage V1 of board 1. The ground plane 52 and the return-signal plane 60 are electrically separated by a housing portion 69 of the connector 50. The aperture 59 is located between planes 52 and 60, and allows connection of at least one high-frequency, signal-bypass capacitor 70 between the ground plane 52 and the return-signal plane 60. The bypass capacitor 70 is illustrated schematically in these figures, and optimally has a plurality of leads connected to each of the ground plane 52 and the signal-return plane 60. The plurality of bypass capacitor leads helps reduce the inductance of the capacitor 70. The bypass capacitor 70 may be any capacitive device known to those in the art, and may be integrated into the connector 50.

While FIGS. 3 and 4 illustrate the connector ground plane 52 as carried on an external surface of the connector 50 and the return-signal plane 60 carried on an internal surface adjacent to the circuit board receptacle 58, the planes may be carried on any portion of the connector 50. Further, while the connector return-signal plane 60 is illustrated as a single structure, it may comprise a plurality of sub-planes, each sub-plane having a contact pin and each coupled to a bypass capacitor 70. Additionally, the connector 50 may include a plurality of connector return-signal planes 60, which may all be arranged for coupling to one circuit board, or one portion may be arranged for coupling to one circuit board and another portion arranged for coupling to another circuit board. Herein, the term "coupled" means either a direct electrical connection between the things that are coupled, or an indirect connection through one or more passive or active intermediary devices.

In use, the connector 50 may be mounted on the circuit board 1 and the contact pin rows 51a and 51b connected to conductors of circuit board 1. The first plurality of ground contacts 54a-d are connected with the ground (GND) of circuit board 1, and the plurality of return-signal contact pins, illustrated as contact pin 62, are connected with a return-signal conductor of a circuit board, such as reference plane 12 at voltage V1 of board 1. When mounted on the circuit board 1 of FIG. 1, the connector 50 will provide a return-signal path between the ground (GND) plane of circuit board 1 and reference plane 12 at voltage V1 through bypass capacitor 70, which functions as the capacitor C1 of FIG. 2. When a circuit board, such as circuit board 3 is coupled by the connector 50 to the circuit board 1, the connector 50 couples the ground plane (not shown) of circuit board 3 to the ground GND of circuit board 1. The connector 50 also couples the ground GND of circuit board 1 to the connector ground plane 52, which is coupled through the bypass capacitor 70 to the connector return-signal plane 60, and is then coupled through the contact pin 62 to the power plane 12. A return signal flowing in the ground plane (not shown) of circuit board 3 is coupled by connector 50 to the ground GND of circuit board 1, and then is coupled substantially within the area of the circuit board 1 occupied by the connector 50 to the connector ground plane 52. From the ground plane 52, the return signal is coupled through the bypass capacitor 70 to the return-signal plane 60, the contact pin 62, and finally to the reference plane 12.

An alternative embodiment of the connector 50 where the connector ground plane 52 includes a second plurality of ground contacts 56a and 56b arranged for coupling with another circuit board ground plane. In this embodiment, the return signal will flow from the ground plane of the circuit board 3 through ground contacts 56a and 56b. The return signal will then flow through bypass capacitor 70, to the return-signal plane 60, the contact pin 62, and to the reference plane 12 without ever flowing in the ground GND of circuit board 1. Both embodiments provide a very short return-signal path from circuit board 3 to the reference plane 12 that does not have significant impedance discontinuities and that does not consume circuit board space beyond that normally required for the connector 50.

A further alternative embodiment of the connector 50 includes another return-signal plane 60 arranged for connecting with the return-signal conductor of the circuit board coupled to circuit board 1, such as circuit board 3, the another return-signal plane 60 will similarly provide a return-signal path between the ground (GND) plane of circuit board 3 (not shown) and V2 or V3, functioning as capacitors C2 and/or C3 of FIG. 2.

Figure 5:
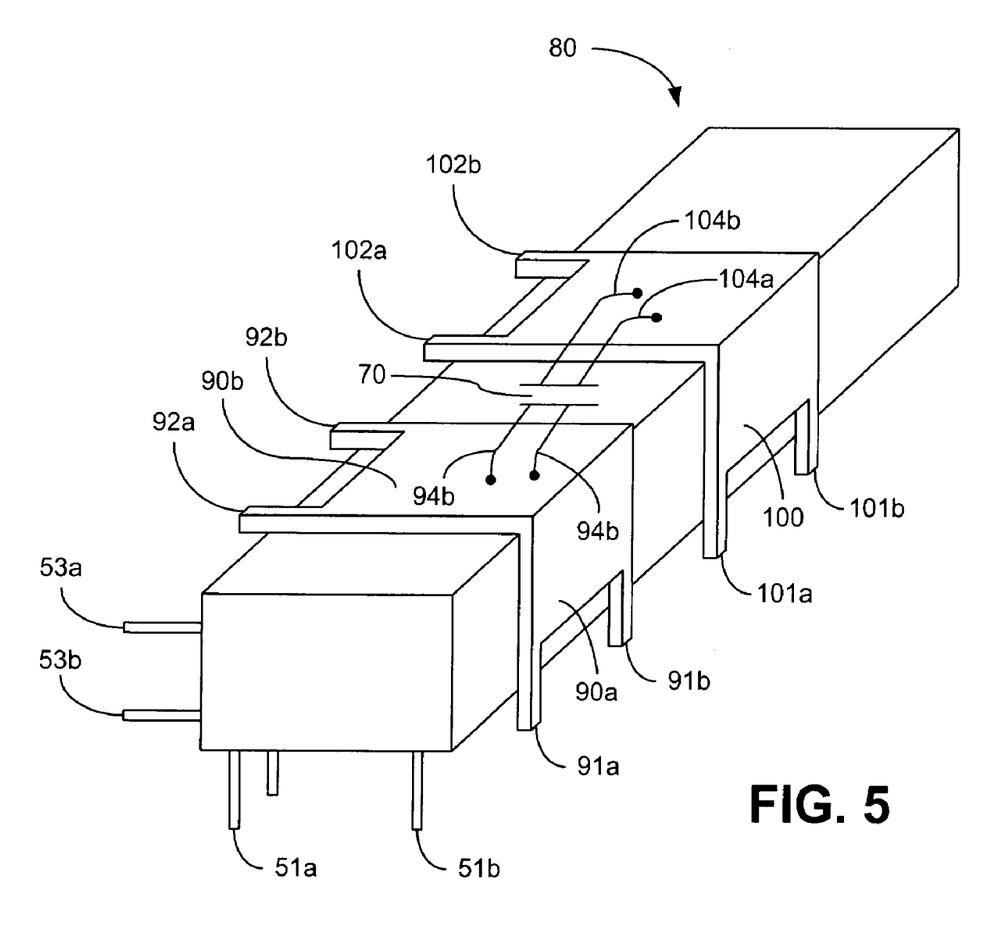
FIG. 5 illustrates a right-angle circuit board connector having a plurality of return-signal planes and an optional bypass capacitor according to an embodiment of the invention.

FIG. 5 illustrates a right-angle circuit board connector 80 having a plurality of return-signal planes shown as planes 90 and 100, and an optional-bypass capacitor 70, according to an embodiment of the invention. Connector 80 provides a structure for coupling a non-ground return-signal path through reference planes on two circuit boards having a common voltage but where the high-speed signal is referenced to one of the reference planes on one of the boards and to another reference plane of another board. Alternatively, the connector 80 may include a two-part mating body for mating as a male-female pair. However, for simplicity, the connector 80 is illustrated herein as a right-angle connector.

Connector 80 includes contact pin rows 51a and 51b for connection to conductors of a first circuit board, and contact pin rows 53a and 53b for connection to conductors of a second circuit board. Connector 80 as illustrated includes two return-signal planes 90 and 100 that connect reference planes carrying the same voltage on each of the connected circuit boards. Signal-return plane 90 includes a conductive sheet having a plurality of contact pins arranged for connection with the conductors of a first circuit board, illustrated as contact pin rows 91a and 91b, and a plurality of contact pins, illustrated as contact pin rows 92a and 92b arranged for connection with the conductors of a second circuit board. Signal-return plane 100 is similar to signal-return plane 90. The bypass capacitor 70 may be coupled between plane 90 and plane 100, preferably using a first plurality of leads 94a-94b and a second plurality of leads 104a-104b.

The return-signal plane 90 bridges the connector 80 and forms one continuous return-signal plane across the connector 80. Other continuous return-signal planes may be included in the connector 80, such as the return-signal plane 100. For example, the return-signal plane 90 can be used when V1 is equal to V4, and board 1 and board 2 will be coupled directly through the connector 80. The return-signal plane 90 will directly couple V1 and V4. The return-signal plane 90 with its plurality of contact pin rows 91a and 91b, and 92a and 92b, form a conductive plane linking the reference planes V1 and V4 into a single conductive plane. The optional capacitor 70 may be coupled between the planes 90 and 100 to provide a pathway for a return signal to "jump" between the planes 90 and 100. Additional bypass capacitors may also be included in the connector 80 to couple the planes 90 and/or 100 to a ground plane, such as the ground plane 52 of FIG. 4.

In use, the connector 80 could be used to couple circuit board 3 to circuit board 1 where V1 equaled V2. A return signal flowing in the plane 32 of the circuit board 3 will be directly coupled by the return-signal plane 90 to the plane 12 of circuit board 1. The return-signal path occurs entirely within the connector 80 without requiring capacitors on either circuit board 1 or 3 to couple the return signal to and from the ground GND. Referring to FIG. 2, connector 80 eliminates C1 and C2 for a return-signal path.

Figure 6:
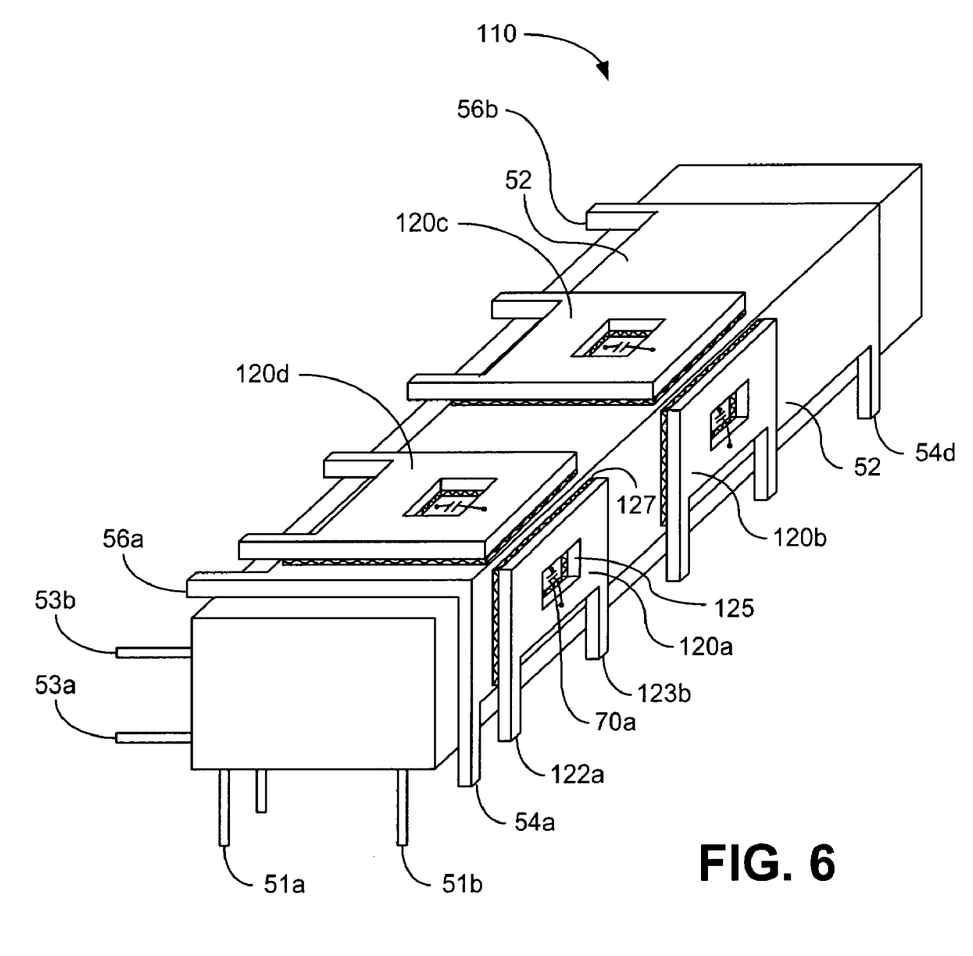
FIG. 6 illustrates a right-angle circuit board connector having a ground plane and a plurality of return-signal planes according to an embodiment of the invention.

FIG. 6 illustrates a right-angle circuit board connector 110 having a ground plane 52, and a plurality of return-signal planes shown as planes 120a-120d according to an embodiment of the invention. Connector 110 is similar to connector 50 of FIG. 3, and provides a structure for capacitively coupling a plurality of non-ground return-signal paths to the common-ground plane 52 where the voltages of the return-signal planes are not passed through the connector. This contrasts with the connector 80 of FIG. 5 where the voltage of the return-signal planes is connected directly through the connector 80. The connector 110 may optionally include another capacitor (not shown) coupling two of the return-signal planes, such as between return-signal plane 120b and 120c.

Connector 110 includes contact pin rows 51a and 51b for connection to conductors of a first circuit board, and contact pin rows 53a and 53b for connection to conductors of a second circuit board. Each return-signal plane 120 includes a plurality of contact pins 122 and 123 for connection to a return-signal conductor. An insulator 127 insulates the return-signal plane 120 from the ground plane 52. A bypass capacitor 70 is coupled between the ground plane 52 and the return-signal plane 120 within a window 125.

In use, the connector 110 couples a return-signal path on a first circuit board to a return-signal path on a second circuit board via the ground plane 52. For example, a return-signal path on the first circuit board is coupled to the return-signal plane 120a. Bypass capacitor 70a couples return-signal plane 120a to the ground plane 52. Ground plane 52 provides a return-signal path through the connector 110. Bypass capacitor 70d couples the ground plane 52 to return-signal plane 120d, which is in turn coupled to the return-signal path on the second circuit board, thus providing a return-signal path that is shorter and more direct than the return-signal path of FIG. 1.

What is claimed is:

1. An electrical connector, comprising:
    a housing portion;
    a first connector reference conductor coupled to the housing portion and arranged for coupling with a first conductive reference plane disposed outside of the housing portion and within a first circuit board;
    a second connector reference conductor disposed in the housing portion and arranged for coupling with a second conductive reference plane disposed outside of the housing portion and within a second circuit board; and
    a capacitor disposed in the housing portion and electrically coupling the first and second connector reference conductors.

2. The connector of claim 1, wherein the first connector reference conductor includes a contact arranged for coupling with the first conductive reference plane.

3. The connector of claim 2, wherein the first connector reference conductor further includes another contact arranged for coupling with a third conductive reference plane.

4. The connector of claim 1, wherein the second connector reference conductor includes a second contact arranged for coupling with the second conductive reference plane.

5. The connector of claim 1, wherein the connector is arranged for mounting on a circuit board.

6. The connector of claim 1, wherein at least one conductive reference plane is a power-supply plane.

7. The connector of claim 1, wherein one conductive reference plane is a ground plane.

8. An electrical connector, comprising:
a first connector reference conductor arranged for coupling with a first conductive reference plane;
a second connector reference conductor arranged for coupling with a second conductive reference plane; and
a capacitor coupled between the first and second connector reference conductors, wherein the first conductive reference plane is a plane in a first circuit board and the second conductive reference plane is a plane in a second circuit board.

9. An electrical connector, comprising:
a first connector reference conductor arranged for coupling with a first circuit-board reference plane;
a second connector reference conductor arranged for coupling with a second circuit-board reference plane; and
a capacitor coupled between the first and second connector reference conductors, wherein the first connector reference conductor is further arranged for coupling with a third circuit-board reference plane.

10. An electrical connector, comprising:
a first connector reference conductor arranged for coupling with a first circuit-board reference plane;
a second connector reference conductor arranged for coupling with a second circuit-board reference plane; and
a capacitor coupled between the first and second connector reference conductors, wherein the first connector reference conductor is further arranged for coupling with a third circuit-board reference plane, and wherein the first connector reference conductor is a plane of a first circuit board and the third circuit-board reference plane is a plane of a second circuit board.

11. An electrical connector, comprising:
a first connector reference conductor arranged for coupling with a first conductive reference plane of a first circuit board;
a second connector reference conductor arranged for coupling with a second conductive reference plane of a second circuit board; and
a capacitor coupled between the first and second connector reference conductors, wherein the first and second conductive reference planes are planes other than a ground plane.

12. An electrical connector, comprising:
a first connector reference conductor arranged for coupling with a first conductive reference plane of a first circuit board;
a second connector reference conductor arranged for coupling with a second conductive reference plane of a second circuit board; and
a capacitor coupled between the first and second connector reference conductors, wherein the capacitor is coupled to the first connector reference conductor at a plurality of locations.

13. An electrical connector, comprising;
a housing portion;
a first connector reference plane coupled to the housing portion and coupleable with a first conductive reference plane of a first circuit board disposed outside of the housing portion; and
a second connector reference plane disposed in the housing portion and coupleable with a second conductive reference plane of a second circuit board disposed outside of the housing portion,
the first and second connector reference planes being electrically coupled together inside of the housing portion, wherein the connector further includes a capacitor, and the first and second connector reference planes are coupled together by the capacitor.

14. An electrical system comprising:
a first circuit board having a first reference plane and a first ground plane;
a second circuit board having a second reference plane and second ground plane; and
a connector that connects the first circuit board and the second circuit board, and that has a first capacitor coupling the first and second reference planes, wherein the connector further includes a second capacitor, and further wherein the first capacitor connects the first reference plane to the first ground and the second capacitor connects the second reference plane to the second ground plane.

15. A method of transmitting a return signal between a first circuit board and a second circuit board, comprising the steps of:
transmitting a return signal in a first conductive reference plane of the first circuit board to a first connector reference conductor of an electrical connector;
capacitively coupling the return signal between the first connector reference conductor and a second connector reference conductor of the electrical connector; and
transmitting the return signal from the second connector reference conductor to a second conductive reference plane of the second circuit board.

16. An electrical connector, comprising:
a housing means;
first means, coupled to the housing means, for coupling with a first conductive reference plane disposed outside of the housing means and within a first circuit board;
second means, disposed in the housing means, for coupling with a second conductive reference plane disposed outside of the housing means and within a second circuit board; and
means, disposed in the housing means, for capacitively coupling the first and second means.

17. An electrical connector, comprising:
a housing portion;
a first connector reference conductor coupled to the housing portion and arranged for coupling with a first circuit-board reference plane disposed outside of the housing portion and within a circuit board;
a second connector reference conductor having a window and disposed in the housing portion and arranged for coupling with a second circuit-board reference plane disposed outside of the housing portion and within the circuit board;
an insulator disposed between the first and second connector reference conductors; and
a capacitor disposed in the housing portion and electrically coupling the first and second connector reference conductors through the window.

18. An electrical connector, comprising:
a housing portion;
a first connector reference conductor coupled to the housing portion and arranged for coupling with a first circuit-board reference plane disposed outside of the housing portion and within a first circuit board;
a second connector reference conductor having a window and disposed in the housing portion and arranged for coupling with a second circuit-board reference plane disposed outside of the housing portion and within a second circuit board;
an insulator disposed between the first and second connector reference conductors; and a capacitor disposed in the housing portion and electrically coupling the first and second connector reference conductors through the window.

* * * * *